(12) United States Patent
Tanaka et al.

(10) Patent No.: US 8,964,190 B2
(45) Date of Patent: Feb. 24, 2015

(54) ALIGNMENT APPARATUS, SUBSTRATES STACKING APPARATUS, STACKED SUBSTRATES MANUFACTURING APPARATUS, EXPOSURE APPARATUS AND ALIGNMENT METHOD

(75) Inventors: Yasuaki Tanaka, Tokyo (JP); Satoro Sanada, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/704,946

(22) Filed: Feb. 12, 2010

(65) Prior Publication Data

US 2010/0231928 A1 Sep. 16, 2010

Related U.S. Application Data

(63) Continuation of application No. PCT/JP2008/002204, filed on Aug. 12, 2008.

(30) Foreign Application Priority Data

Aug. 15, 2007 (JP) ................................. 2007-211672

(51) Int. Cl.
*G01B 11/00* (2006.01)
*G01B 11/14* (2006.01)
*H01L 21/67* (2006.01)
*H01L 21/68* (2006.01)
*H01L 23/544* (2006.01)

(52) U.S. Cl.
CPC .......... *H01L 21/67092* (2013.01); *H01L 21/68* (2013.01); *H01L 21/681* (2013.01); *H01L 23/544* (2013.01); *H01L 2223/54426* (2013.01); *H01L 2223/54453* (2013.01); *H01L 2223/54493* (2013.01)

USPC ............ 356/620; 356/399; 356/401; 356/614

(58) Field of Classification Search
None
See application file for complete search history.

(56) References Cited

U.S. PATENT DOCUMENTS

| 4,189,230 | A | * | 2/1980 | Zasio | ............................. | 355/76 |
| 4,466,073 | A | * | 8/1984 | Boyan et al. | .................. | 356/400 |
| 4,892,455 | A | * | 1/1990 | Hine | ........................ | 414/416.03 |

(Continued)

FOREIGN PATENT DOCUMENTS

| CN | 1531051 A | 9/2004 |
| CN | 1787200 A | 6/2006 |

(Continued)

OTHER PUBLICATIONS

Decision of Rejection, Application No. 200880111639.X, State Intellectual Property Office of People's Republic of China, Apr. 23, 2012, 16 pages.

(Continued)

*Primary Examiner* — Gordon J Stock, Jr.
(74) *Attorney, Agent, or Firm* — Finnegan, Henderson, Farabow, Garrett & Dunner, LLP

(57) ABSTRACT

The throughput of the alignment in an alignment apparatus is improved. There is provided an alignment apparatus for aligning a substrate having an alignment mark, including a first aligner that aligns the substrate to a first reference position, a second aligner that aligns a substrate holder to a second reference position before the substrate holder holds the substrate, and a position detector that detects a position of the alignment mark of the substrate after the substrate holder holds the substrate.

47 Claims, 17 Drawing Sheets

(56) References Cited

U.S. PATENT DOCUMENTS

| | | | |
|---|---|---|---|
| 5,105,147 A * | 4/1992 | Karasikov et al. | 324/537 |
| 5,737,441 A * | 4/1998 | Nishi | 382/151 |
| 5,825,043 A * | 10/1998 | Suwa | 250/548 |
| 6,577,382 B2 * | 6/2003 | Kida et al. | 355/77 |
| 6,836,690 B1 * | 12/2004 | Spady et al. | 700/108 |
| 6,857,838 B2 * | 2/2005 | Kuroda | 414/331.01 |
| 7,015,418 B2 * | 3/2006 | Cahill et al. | 219/121.69 |
| 7,053,393 B2 * | 5/2006 | Taniguchi et al. | 250/559.3 |
| 7,126,689 B2 * | 10/2006 | Nishi | 356/400 |
| 7,477,390 B2 * | 1/2009 | Koga | 356/401 |
| 8,129,201 B2 * | 3/2012 | Okamoto | 438/6 |
| 8,139,219 B2 * | 3/2012 | George | 356/401 |
| 8,244,399 B2 * | 8/2012 | Maeda et al. | 700/213 |
| 8,336,866 B2 * | 12/2012 | Fujii et al. | 269/249 |
| 2001/0017939 A1 * | 8/2001 | Yoshida | 382/151 |
| 2006/0273440 A1 * | 12/2006 | Okamoto | 257/686 |
| 2007/0111471 A1 * | 5/2007 | Okada | 438/455 |
| 2007/0166134 A1 | 7/2007 | Suzuki | |
| 2008/0188072 A1 * | 8/2008 | Johnson et al. | 438/615 |
| 2008/0316504 A1 * | 12/2008 | Nemets et al. | 356/614 |
| 2010/0171823 A1 * | 7/2010 | Yamamoto et al. | 348/95 |
| 2011/0188016 A1 * | 8/2011 | De Jager et al. | 355/55 |

FOREIGN PATENT DOCUMENTS

| | | | |
|---|---|---|---|
| CN | 101001518 A | | 7/2007 |
| CN | 100355055 C | | 12/2007 |
| EP | 989596 A1 | * | 3/2000 |
| JP | 2002124556 A | * | 4/2002 |
| JP | 2005-251972 A | | 9/2005 |
| JP | 2005251972 A | * | 9/2005 |
| JP | 2006-100656 | | 4/2006 |
| JP | 2007-158199 | | 6/2007 |
| KR | 20010013658 | | 2/2001 |
| KR | 20070008249 A | | 1/2007 |
| KR | 100697661 B1 | | 3/2007 |
| WO | WO 2007/072817 A1 | | 6/2007 |

OTHER PUBLICATIONS

Office Action issued from the Japanese Patent Office related to Japanese Application No. 2013-169509, dated Jul. 22, 2014.

Office Action issued from the Taiwanese Patent Office related to Taiwanese Application No. 0971302285, dated Jun. 30, 2014.

Office Action issued from the Korean Patent Office related to Korean Application No. 10-2010-7005460, dated Jul. 21, 2014.

* cited by examiner

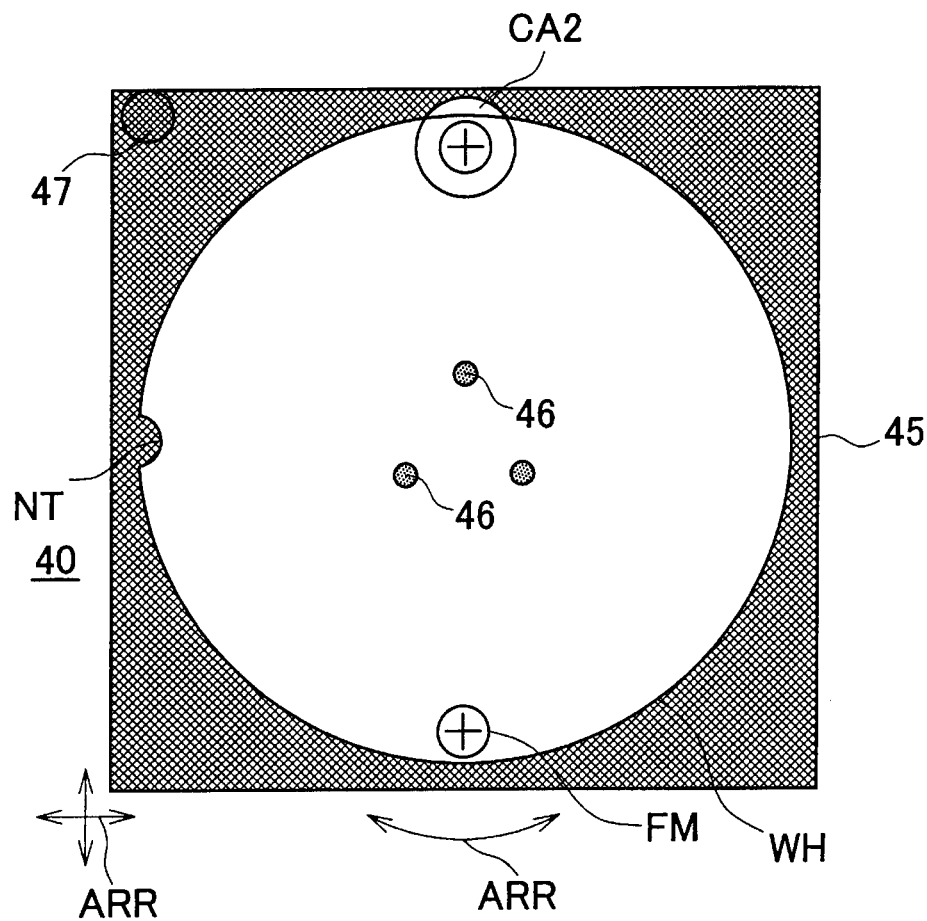
F I G . 7A

ALIGNMENT APPARATUS, SUBSTRATES STACKING APPARATUS, STACKED SUBSTRATES MANUFACTURING APPARATUS, EXPOSURE APPARATUS AND ALIGNMENT METHOD

CROSS REFERENCE TO RELATED APPLICATION

This is a continuation application of PCT/JP2008/2204 filed on Aug. 12, 2008 which claims priority from a Japanese Patent Application NO. 2007-211672 filed on Aug. 15, 2007.

BACKGROUND

1. Technical Field

The present invention relates to an alignment apparatus, a substrate stacking apparatus, a multilayered substrate manufacturing apparatus, an exposure apparatus and an alignment method.

2. Related Art

Japanese Patent Application Publication No. 2005-026278 discloses that a multilayered element may be manufactured by overlapping elements on one another. Japanese Patent Application Publication No. 2007-103225 discloses a technique to improve the productivity of the multilayered semiconductor device manufacturing process by layering wafers in each of which a plurality of chips are formed. To manufacture a multilayered semiconductor device by layering elements on one another, the elements are first aligned to each other on the order of submicrons and then attached to each other.

To align substrates or the like to each other on the order of submicrons, the positions of alignment marks formed on the substrates are detected with accuracy on the order of submicrons. The substrates are then moved and aligned in such a manner that the detected positions of the alignment marks match predetermined target positions.

When a high-accuracy position detecting apparatus is utilized, however, it takes an enormously long time to complete the alignment when the alignment marks are initially positioned far away from the target positions. Therefore, the throughput of the multilayered semiconductor device manufacturing process is lowered.

SUMMARY

Therefore, it is an object of an aspect of the innovations herein to provide an alignment apparatus, a substrate stacking apparatus, a multilayered substrate manufacturing apparatus, an exposure apparatus and an alignment method which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary alignment apparatus for aligning a substrate having an alignment mark may include a first aligner that aligns the substrate to a first reference position, a second aligner that aligns a substrate holder to a second reference position before the substrate holder holds the substrate, and a position detector that detects a position of the alignment mark of the substrate after the substrate holder holds the substrate.

According to a different aspect related to the innovations herein, one exemplary substrate stacking apparatus may include the above-described alignment apparatus, and the substrate stacking apparatus stacks, on one another, paired substrates each of which has an alignment mark after the alignment apparatus aligns the substrates to a same position.

According to a different aspect related to the innovations herein, one exemplary multilayered substrate manufacturing apparatus may include the above-described alignment apparatus, a stacking section that stacks, on one another, paired substrates each of which has an alignment mark after the alignment apparatus aligns the substrates to a same position, and a pressurizing section that applies a pressure to the substrates that have been stacked on one another to permanently bond the substrates to each other.

According to a different aspect related to the innovations herein, one exemplary exposure apparatus may include the above-described alignment apparatus, and the alignment apparatus aligns at least one of a pattern formed substrate having an alignment mark and a to-be-exposed substrate having an alignment mark.

According to a different aspect related to the innovations herein, one exemplary alignment method for aligning a substrate having an alignment mark may include aligning the substrate to a first reference position, aligning a substrate holder to a second reference position before the substrate holder holds the substrate, and detecting a position of the alignment mark of the substrate after the substrate holder holds the substrate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 7A is a top view illustrating a wafer holder pre-alignment apparatus 40.

DESCRIPTION OF EXEMPLARY
EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
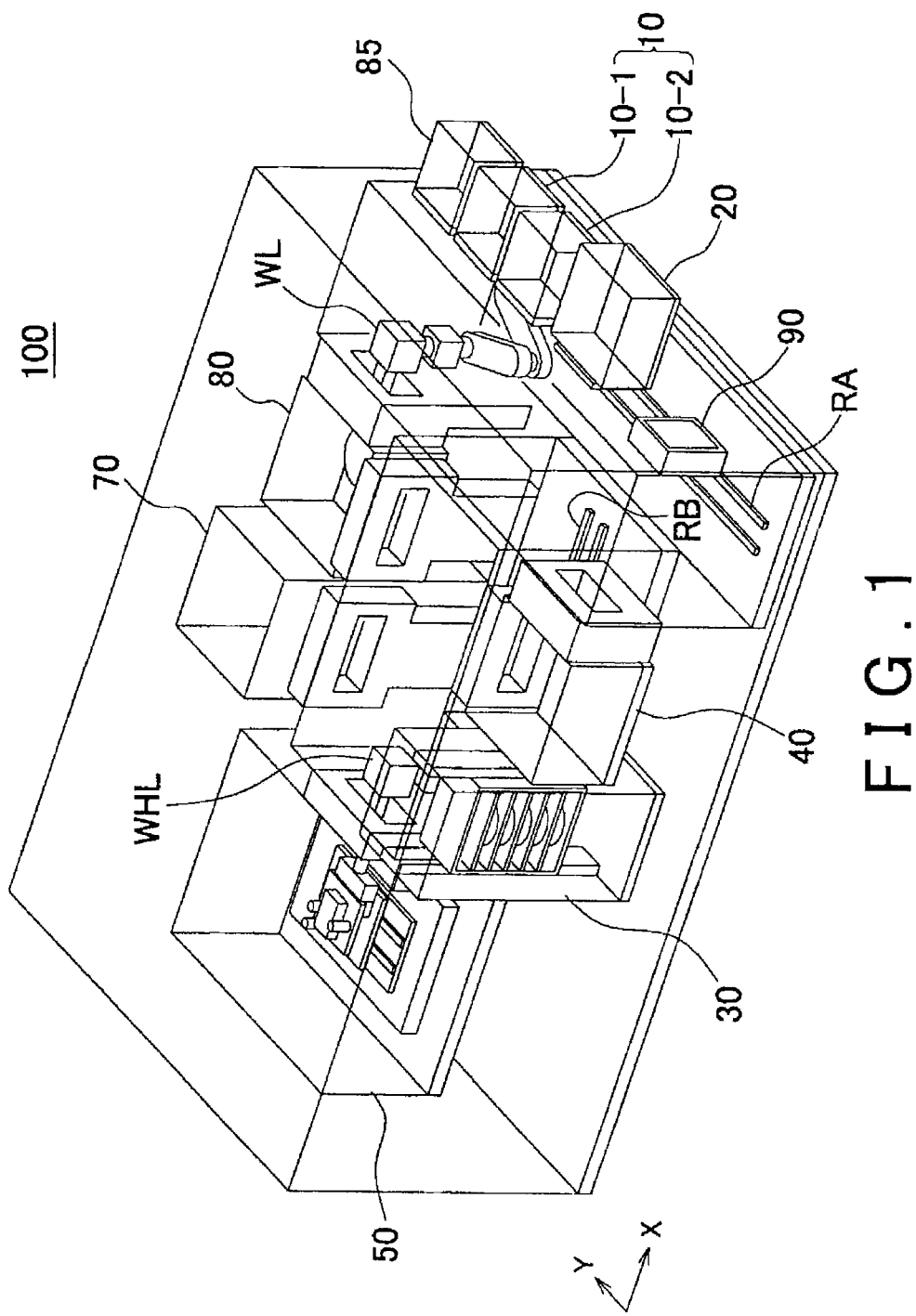
FIG. 1 is a perspective view illustrating the entire structure of a multilayered substrate manufacturing apparatus 100.
Figure 2:
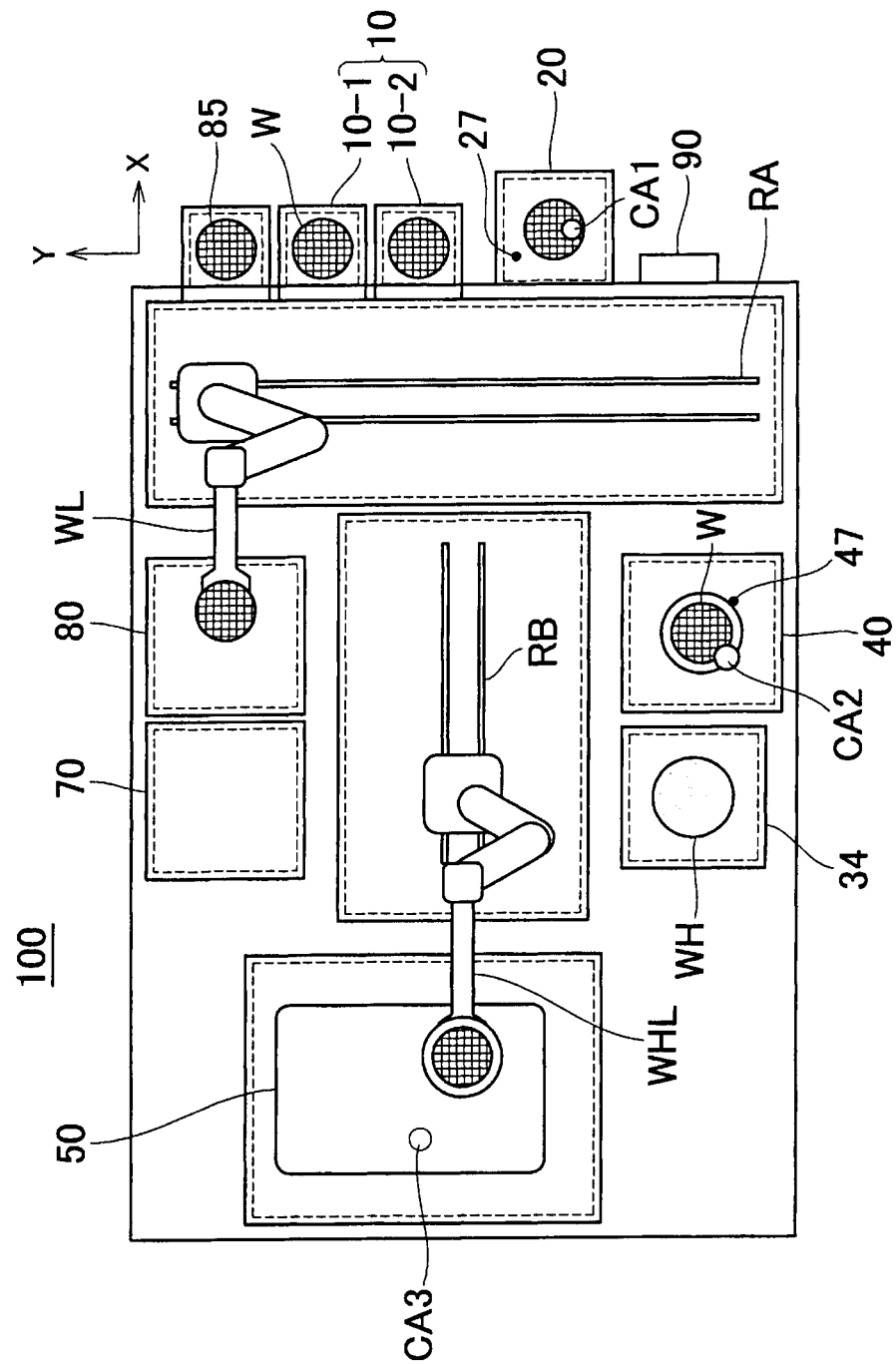
FIG. 2 is a top view schematically illustrating the multilayered substrate manufacturing apparatus 100.

FIG. 1 is a perspective view illustrating the entire structure of a multilayered substrate manufacturing apparatus 100. FIG. 2 is a top view schematically illustrating the multilayered substrate manufacturing apparatus 100.

The multilayered substrate manufacturing apparatus 100 includes wafer storages 10 (10-1 and 10-2), a wafer pre-alignment apparatus 20, a wafer holder storage 30, a wafer holder pre-alignment apparatus 40, an aligner 50, a pressurizing apparatus 70, a separating and cooling unit 80, a multilayered substrate storage 85, a main controller 90, a wafer loader WL, and a wafer holder loader WHL. The following describes each of the above-listed constituents.

The wafer storages 10 are detachably mounted so as to face the outside of the multilayered substrate manufacturing apparatus 100. The wafer storages 10 include a wafer storage 10-1 for housing therein first semiconductor wafers W and a wafer storage 10-2 for housing therein second semiconductor wafers W. Here, a first semiconductor wafer W and a second semiconductor wafer W are stacked on one another. The wafer storages 10-1 and 10-2 each have a plurality of wafers loaded therein, so that the multilayered substrate manufacturing apparatus 100 can successively manufacture multilayered substrates.

The wafer pre-alignment apparatus 20 is positioned in the vicinity of the wafer storages 10. The wafer pre-alignment apparatus 20 roughly aligns individual wafers W. The constituents and operations of the wafer pre-alignment apparatus 20 will be described later in detail with reference to FIGS. 4A, 4B, 5A, 5B, 6A, 6B, and 6C.

The wafer holder storage 30 is provided within the multilayered substrate manufacturing apparatus 100 and houses therein a plurality of wafer holders WH. The wafer holders WH attract wafers W by suction and support the wafers W. Furthermore, the wafer holders WH are shared by more than one constituent within the multilayered substrate manufacturing apparatus 100.

In the multilayered substrate manufacturing apparatus 100, the wafer holders WH can be used for both the first semiconductor wafers W and the second semiconductor wafers W. Therefore, the wafer holders WH housed in the wafer holder storage 30 all have the same specifications. There may be, however, a case where wafer holders WH of two or more types are used as appropriate.

The wafer holder pre-alignment apparatus 40 is positioned in the vicinity of the wafer holder storage 30. The wafer holder pre-alignment apparatus 40 pre-aligns the wafer holders WH. The constituents and operations of the wafer holder pre-alignment apparatus 40 will be described later with reference to FIGS. 7A, 7B, 8 and 9.

The aligner 50 is provided on the back side with respect the wafer storages 10 in the multilayered substrate manufacturing apparatus 100. The aligner 50 aligns a first semiconductor wafer and a second semiconductor wafer, which are respectively held by different wafer holders WH, to each other with high accuracy and then stacks the aligned first and second semiconductor wafers on one another. Here, the "high accuracy" is equivalent to the line width of the elements formed on the semiconductor wafers W and may be on the order of submicrons.

Here, the "alignment" represents a process employed to stack two semiconductor wafers W on one another, which matches the positions of the semiconductor wafers W to each other in such a manner that the connection terminals of the elements formed in one of the semiconductor wafers W are effectively electrically connected to the connection terminals of the elements formed in the other semiconductor wafer W. The constituents and operations of the aligner 50 will be described later with reference to FIGS. 10 and 11.

The pressurizing apparatus 70 is positioned in the vicinity of the aligner 50. The pressurizing apparatus 70 applies pressure to the semiconductor wafers W that have been stacked on one another by the aligner 50, to create permanent attachment. In some cases, the pressurizing apparatus 70 may apply pressure to the semiconductor wafers W that have been stacked on one another while heating the semiconductor wafers W to create the permanent attachment. The constituents and operations of the pressurizing apparatus 70 will be described later with reference to FIG. 12.

The separating and cooling unit 80 is provided adjacent to the pressurizing apparatus 70. The separating and cooling unit 80 removes the wafer holders WH from the semiconductor wafers W that have been stacked on one another and cools down the semiconductor wafers W that have been stacked on one another and the wafer holders WH. The cooled-down semiconductor wafers W are put into the multilayered substrate storage 85 as a multilayered substrate. The cooled-down wafer holders WH are returned back to the wafer holder storage 30.

The multilayered substrate storage 85 is detachably mounted so as to face the outside of the multilayered substrate manufacturing apparatus 100. This enables the accumulated multilayered substrates to be collectively acquired by removing the multilayered substrate storage 85 from the multilayered substrate manufacturing apparatus 100.

The wafer loader WL is a multi-joint robot having an arm with six-degree-of-freedom motion (in the X, Y, Z, θX, θY, and θZ directions). The wafer loader WL travels a long distance along a rail RA in the direction represented by the arrow Y in FIGS. 1 and 2.

The wafer loader WH can move with a semiconductor wafer W or semiconductor wafers that have been stacked on one another into a multilayered substrate loaded thereon. Note that, however, the wafer loader WL cannot transport a wafer holder WH, whose mass is significantly larger than the mass of a semiconductor wafer W or multilayered substrate. Accordingly, the wafer loader WH transports a semiconductor wafer W mainly between the wafer storages 10 and the wafer pre-alignment apparatus 20.

The wafer holder loader WHL is similarly a multi-joint robot having an arm with six-degree-of-freedom motion (in the X, Y, Z, θX, θY, and θZ directions). The wafer holder loader WHL travels a long distance along a rail RB in the direction represented by the arrow X in FIGS. 1 and 2.

The wafer holder loader WHL can withstand the transportation load of a wafer holder WH and can also transport a semiconductor wafer W. Accordingly, the wafer holder loader WHL transports a wafer holder WH between the wafer holder storage 30 and the wafer holder pre-alignment apparatus 40, or between the separating and cooling unit 80 and the wafer holder storage 30. Furthermore, the wafer holder loader WHL transports a wafer holder WH and a semiconductor wafer W at the same time between the wafer holder pre-alignment apparatus 40 and the aligner 50, between the aligner 50 and the pressurizing apparatus 70, or between the pressurizing apparatus 70 and the separating and cooling unit 80. Furthermore, the wafer holder loader WHL may transport a multilayered wafer during at least partially between the separating and cooling unit 80 and the multilayered substrate storage 85.

The main controller 90 controls the operations of the above-described multilayered substrate manufacturing apparatus 100 as a whole. Specifically speaking, the main controller 90 exchanges signals with the individual controllers of the wafer loader WL, the wafer holder loader WHL, the wafer pre-alignment apparatus 20, and the wafer holder pre-alignment apparatus 40, to perform comprehensive control of the multilayered substrate manufacturing apparatus 100 as a whole. The main controller 90 also receives external manipulations such as power-on and power-off manipulations.

Figure 3:
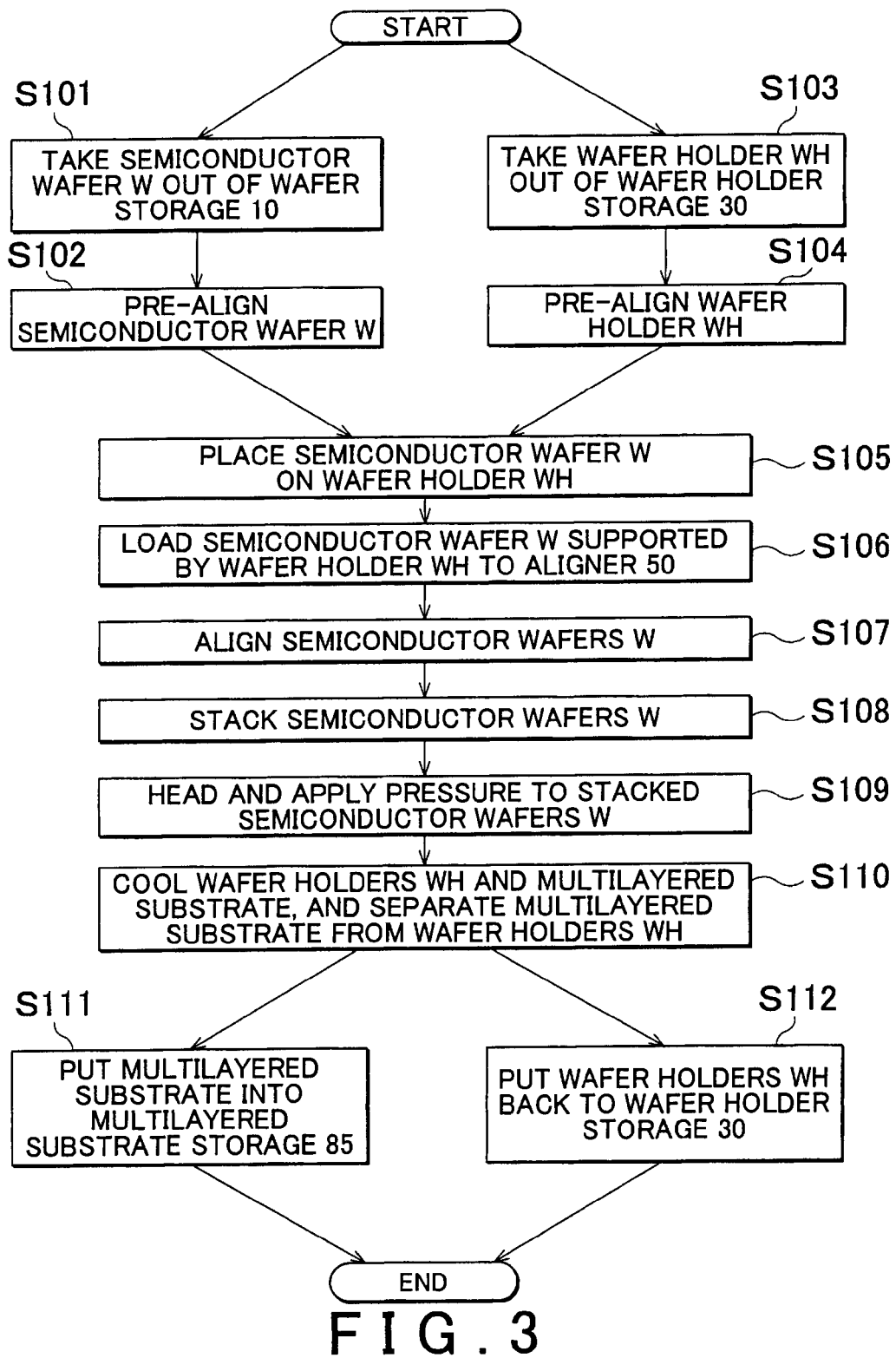
FIG. 3 is a flow chart illustrating the flow of operations included in a wafer stacking method.

FIG. 3 is a flow chart illustrating the flow of operations included in a wafer stacking method performed by using the above-described multilayered substrate manufacturing apparatus 100. As shown in FIG. 3, the wafer loader WL takes a semiconductor wafer W out of the wafer storages 10 (step S101). Subsequently, the wafer loader WL loads the semiconductor wafer W onto the wafer pre-alignment apparatus 20, so that the semiconductor wafer W is pre-aligned (step S102).

In addition, the wafer holder loader WHL takes a wafer holder WH out of the wafer holder storage 30 (step S103). Subsequently, the wafer holder loader WHL loads the wafer holder WH onto the wafer holder pre-alignment apparatus 40, so that the wafer holder WH is pre-aligned (step S104). Here, the steps S101 and S102 may be performed in parallel with, or before or after the steps S103 and S104.

Subsequently, the wafer loader WH loads the pre-aligned semiconductor wafer W onto the pre-aligned wafer holder WH (step S105). In this way, the semiconductor wafer W is loaded onto and held by the wafer holder WH in a state of being aligned with certain accuracy determined by the accuracies of the respective pre-alignment processes. The above-described series of steps S101 to S105 are performed separately for a first semiconductor wafer W and a second semiconductor wafer W.

Subsequently, the first and second semiconductor wafers W held by different wafer holders WH are sequentially loaded onto the aligner 50 by the wafer holder loader WHL (step S106). The aligner 50 aligns one of the first and second semiconductor wafers W, for example, in such a manner that the alignment marks of the second semiconductor wafer W directly or indirectly match with the alignment marks of the first semiconductor wafer W with high accuracy (step S107). Here, "indirectly matching" means that, for example, the first and second semiconductor wafers W are aligned while monitoring the fiducial marks of the first semiconductor wafer W and the alignment marks of the second semiconductor wafer W. This "indirectly matching" process will be described later with reference to FIG. 11. The first and second semiconductor wafers W that have been aligned to each other are brought into a tight contact with each other and stacked onto one another by the aligner 50 (step S108).

The semiconductor wafers W that have been stacked on one another are transported into the pressurizing apparatus 70 by the wafer holder loader WHL while being sandwiched between the wafer holders WH (step S109). Thus, the semiconductor wafers W are permanently joined to each other, after which the semiconductor wafers W and the wafer holders WH are transported out by the wafer holder loader WHL and then transported to the separating and cooling unit 80.

The separating and cooling unit 80 takes the semiconductor wafers W, which have been joined together to form a multilayered substrate, out of the wafer holders WH (step S110).

After taken out of the wafer holders WH, the multilayered substrate is put into the multilayered substrate storage 85 by the wafer loader WL (step S111). The wafer holders WH, which have been separated from the multilayered substrate, are returned back to the wafer holder storage 30 by the wafer holder loader WHL (step S112).

As described above, before semiconductor wafers W are loaded onto wafer holders WH, the semiconductor wafers W and the wafer holders WH are separately pre-aligned. In this manner, the displacement of the semiconductor wafers W as loaded onto the wafer holders WH can be reduced to fall within a predetermined range. Consequently, the multilayered substrate manufacturing apparatus 100 having the above-described configuration can shorten the time required to complete the high-accuracy alignment, thereby improving the throughput of the multilayered substrate manufacturing process.

Figure 4A:
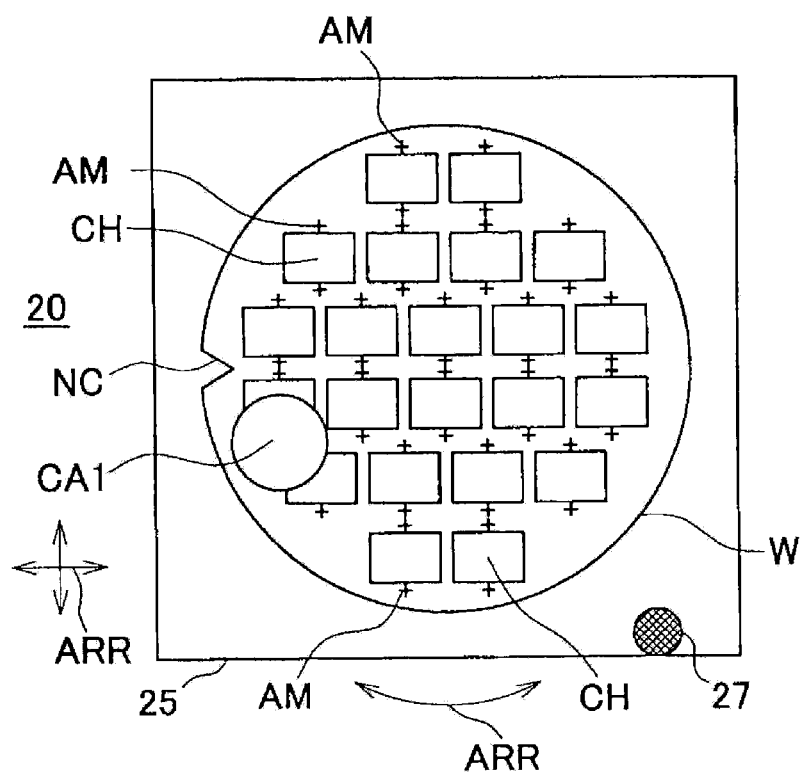
FIG. 4A is a top view illustrating a wafer pre-alignment apparatus 20.
Figure 4B:
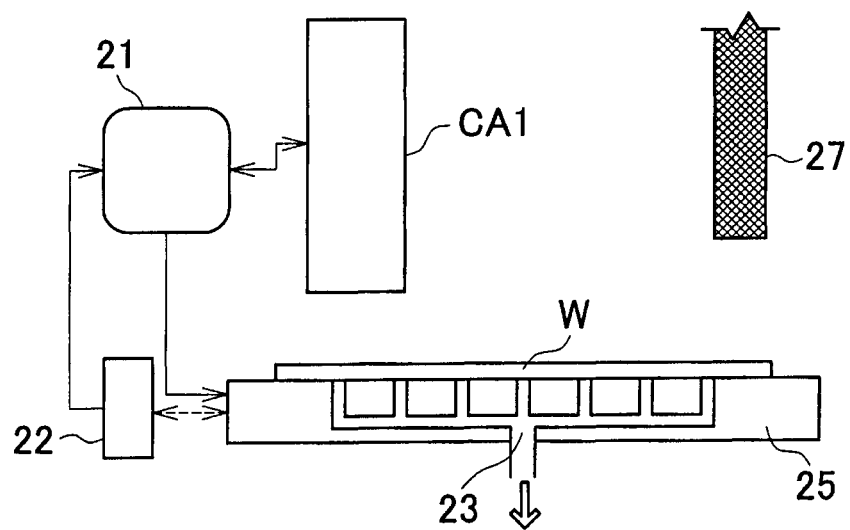
FIG. 4B is a lateral view illustrating the wafer pre-alignment apparatus 20.

FIG. 4A is a top view illustrating the wafer pre-alignment apparatus 20. FIG. 4B is a lateral view illustrating the wafer pre-alignment apparatus 20.

The wafer pre-alignment apparatus 20 includes a first XYθ stage 25, a vacuum chuck 23, a first laser interferometer (hereinafter, referred to as the first interferometer) 22, a wafer alignment camera CA1, and a wafer pre-alignment controller 21. As indicated by the arrows ARR in FIG. 4A, the first XYθ stage 25 is servo-controlled to move and rotate in the X, Y and θ directions.

The vacuum chuck 23 attracts a semiconductor wafer W by suction and releases the semiconductor wafer W by means of a vacuum pump, which is not shown. The first XYθ stage 25 has a lift pin, which is not shown, to lift a semiconductor wafer W in order to transfer and receive the semiconductor wafer W to/from the wafer loader WL. While attracted by the vacuum chuck 23 by suction, a semiconductor wafer W moves or rotates along with the first XYθ stage 25.

A semiconductor wafer W, which is to be loaded to the wafer pre-alignment apparatus 20, has semiconductor chip regions CH formed therein with approximately several dozen to several hundred shots. The semiconductor wafer W has a notch NC on its periphery, which indicates the crystal direction of the semiconductor wafer W. The semiconductor wafer W also has a plurality of alignment marks AM, which are used during a photolithography step. The alignment marks AM are shaped like a cross or circle.

The wafer alignment camera CA1 has a magnification ratio of approximately 1:1 to 10:1, and may have an auto-focusing mechanism as necessary. The first XYθ stage 25 moves in the X and Y directions so that the wafer alignment camera CA1 can observe the alignment marks AM, in other words, so that the alignment marks AM are positioned immediately below the wafer alignment camera CA1, which is secured in place. Thus, the semiconductor wafer W can be aligned by using the position of the wafer alignment camera CA1 as a reference point. Here, the pre-alignment of the semiconductor wafer W is performed by using the alignment marks AM used during a photolithography step in the present embodiment, but may be performed by using different marks.

The first interferometer 22 always monitors the position of the first XYθ stage 25. The position of the first XYθ stage 25 detected by the first interferometer 22 is sent to the wafer pre-alignment controller 21. A position signal representing the positions of the alignment marks AM examined by the wafer alignment camera CA1 is also sent to the wafer pre-alignment controller 21.

Based on the position of the first XYθ stage 25 and the positions of the alignment marks AM, the wafer pre-alignment controller 21 calculates the displacement of the semiconductor wafer W with respect to a predetermined position in the X, Y and θ directions, and then moves and rotates the first XYθ stage 25 in such a manner to eliminate the calculated displacement. As a result of such pre-alignment, the semiconductor wafer W is aligned to be positioned within a certain range from an intended reference value according to design specifications, for example, within approximately 30 μm or less.

The aligned semiconductor wafer W is released from the vacuum suction provided by the vacuum chuck 23 and lifted by the lift pin. The wafer loader WL holds the aligned semiconductor wafer W, and transports the semiconductor wafer W to load the semiconductor wafer W onto a wafer holder WH.

Here, the wafer pre-alignment controller 21 may control the wafer alignment camera CA1 to observe two or more, for example, approximately ten alignment marks AM. Thus, the relation between intended alignment marks AM according to design specifications and actual alignment marks AM that are actually formed on the semiconductor wafer W and observed by the wafer alignment camera CA1 is obtained, and intended arrangement of semiconductor chip regions CH according to design specifications is corrected by using the least squares method in such a manner that the overlapping errors between the intended alignment marks AM and the actual alignment marks AM are as a whole reduced for all of the semiconductor chip regions CH. In this manner, the positions of actually-formed semiconductor chip regions CH can be obtained. This method is disclosed in detail in Japanese Patent Application Publication No. 62-044429.

The wafer pre-alignment apparatus 20 further has a first positioning pole 27 that is secured at a predetermined position. The following describes how the wafer loader WL transports the semiconductor wafer W out of the wafer pre-alignment apparatus 20 with reference to FIGS. 5A and 5B.

Figure 5A:
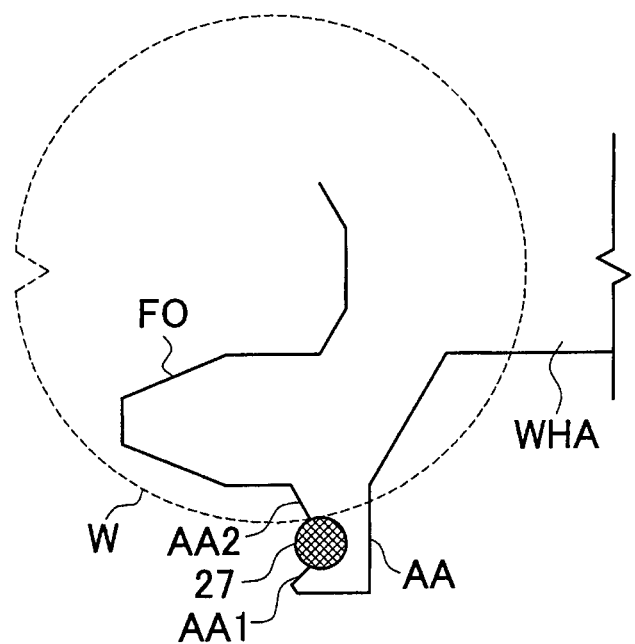
FIG. 5A is a top view illustrating a different wafer pre-alignment apparatus 20.
Figure 5B:
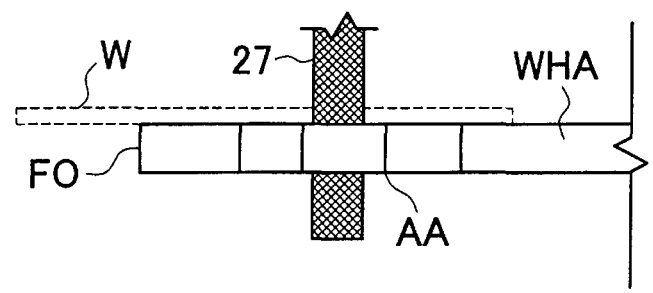
FIG. 5B is a lateral view illustrating the different wafer pre-alignment apparatus 20.

FIG. 5A is a top view used to illustrate the operations of the first positioning pole 27 and the wafer loader WL. FIG. 5B is a lateral view used to illustrate the operations of the first positioning pole 27 and the wafer loader WL.

The wafer loader WL has a fork FO and a hand WHA. Furthermore, the hand WHA has a positioning arm AA that positions the fork FO and the hand WHA at predetermined positions. The positioning arm AA has a depression AA1 whose size matches the diameter of the first positioning pole 27, and is disposed so as not to interfere with the semiconductor wafer W, which is placed on the fork FO. The positioning arm AA has a tapered portion AA2 that guides the first positioning pole 27 into the depression AA1.

When the hand WHA comes closer to the wafer pre-alignment apparatus 20 in order to receive the pre-aligned semiconductor wafer W, the positioning arm AA is brought into a contact with the first positioning pole 27, so that the hand WHA is kept stationary at a predetermined position. The hand WHA receives the semiconductor wafer W from the first XYθ stage 25, which has been manipulated to compensate for the displacement of the semiconductor wafer W. Therefore, the hand WHA receives and transports the semiconductor wafer W without changing the aligned state of the semiconductor wafer W. The hand WHA moves in the X and Y directions when the first positioning pole 27 is inserted into the hand WHA, but the movement is little and is absorbed by the joints of the multi-joint robot.

Figure 6A:
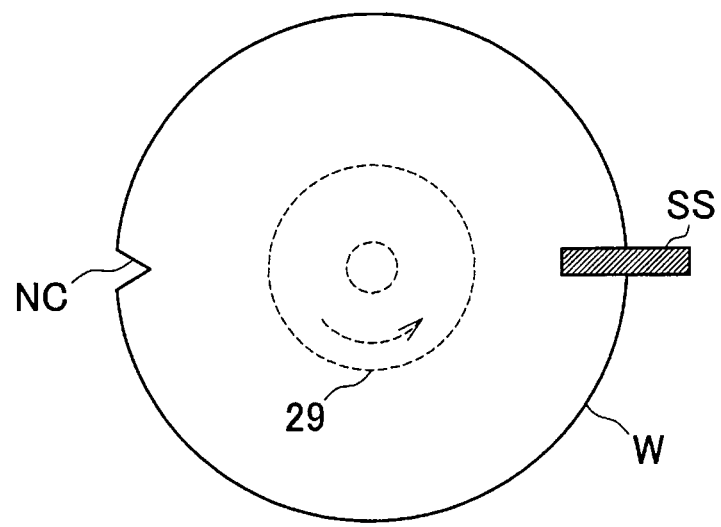
FIG. 6A is a top view illustrating the structure of a further different wafer pre-alignment apparatus 20.
Figure 6B:
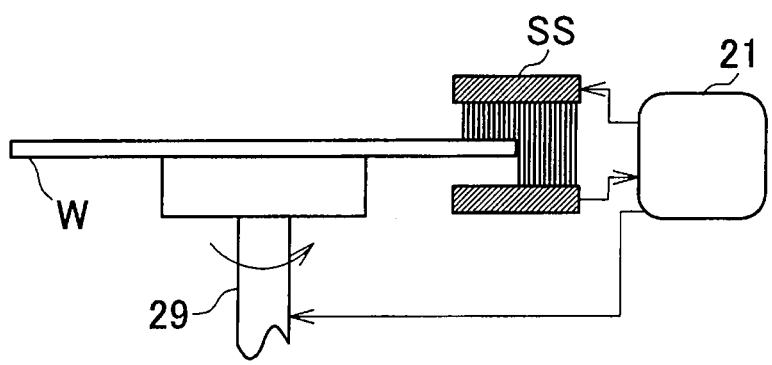
FIG. 6B is a lateral view illustrating the structure of the further different wafer pre-alignment apparatus 20.

FIG. 6A is a top view illustrating the structure of a different wafer pre-alignment apparatus 20. FIG. 6B is a lateral view illustrating the structure of the wafer pre-alignment apparatus 20 shown in FIG. 6A.

This wafer pre-alignment apparatus 20 includes a θ stage 29 that rotates around a vertical rotation axis, and a line sensor SS that is provided so as to be orthogonal to the rotation axis of the θ stage 29 and extend in the radial direction of the θ stage 29. When the wafer loader WL places a semiconductor wafer W on the θ stage 29, the line sensor SS moves up to the periphery of the semiconductor wafer W and examines the periphery of the semiconductor wafer W. Here, the θ stage 29 also has a wafer lift pin, a vacuum chuck and the like, which are not shown.

Figure 6C:
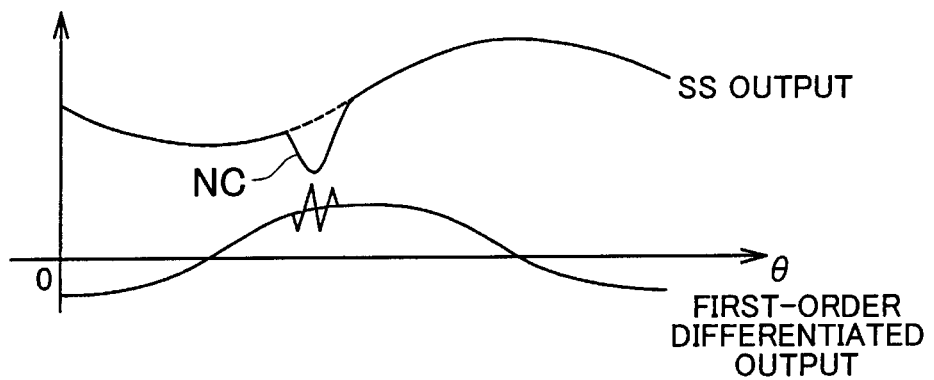
FIG. 6C is a waveform diagram used to illustrate the operations of the further different wafer pre-alignment apparatus 20.

FIG. 6C is a waveform diagram used to illustrate the operations of the wafer pre-alignment apparatus 20 shown in FIGS. 6A and 6B. When the θ stage 29 that is holding the semiconductor wafer W rotates, the radial position of the edge of the semiconductor wafer W continuously changes and the line sensor SS thus outputs a signal having the upper waveform shown in FIG. 6C.

The wafer pre-alignment controller 21 first-order differentiates the output signal and consequently obtains the lower signal shown in FIG. 6C. If the first-order differentiated signal is horizontally linear, it is proved that the center of the semiconductor wafer W matches the rotation axis of the θ stage 29. In addition, since the first-order differentiated signal tells the position of the notch NC of the semiconductor wafer W, the orientation of the semiconductor wafer W is determined by referring to the amount of the rotation of the θ stage 29 from the detected position of the notch NC.

The above-described processes determine the position at which the semiconductor wafer W is held with respect to the rotation axis of the θ stage 29. Consequently, the semiconductor wafer W can be loaded onto a wafer holder WH in the state of being aligned thereto, by moving the wafer holder WH in a manner to eliminate the displacement of the semiconductor wafer W when the semiconductor wafer W is loaded onto the wafer holder WH.

Figure 7B:
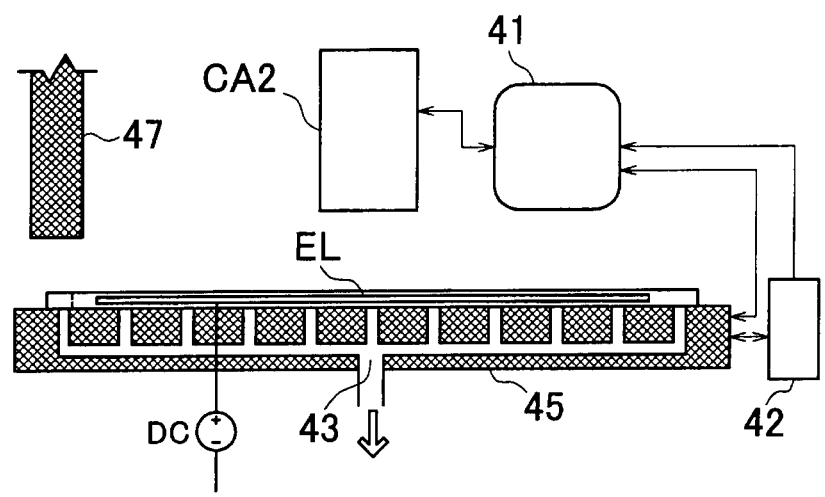
FIG. 7B is a lateral view illustrating the wafer holder pre-alignment apparatus 40.

FIG. 7A is a top view illustrating the wafer holder pre-alignment apparatus 40. FIG. 7B is a lateral view illustrating the wafer holder pre-alignment apparatus 40 shown in FIG. 7A.

The wafer holder pre-alignment apparatus 40 includes a second XYθ stage 45, a vacuum chuck 43, a second laser interferometer (hereinafter, referred to as the second interferometer) 42, a wafer holder alignment camera CA2, and a wafer holder pre-alignment controller 41. As indicated by the arrows ARR in FIG. 7A, the second XYθ stage 45 is servo-controlled to move and rotate in the X, Y and θ directions.

The vacuum chuck 43 attracts a semiconductor wafer W by suction and releases the semiconductor wafer W by means of a vacuum pump, which is not shown. The second XYθ stage 45 has a lift pin, which is not shown, to lift a wafer holder WH in order to transfer and receive the wafer holder WH to/from the wafer holder loader WHL. While attracted by the vacuum chuck 43 by suction, a wafer holder WH moves or rotates along with the second XYθ stage 45. The vacuum chuck 43 has wafer lift pins 46 for exchanging a semiconductor wafer W through three holes formed in the wafer holder WH.

A wafer holder WH, which is to be loaded onto the wafer holder pre-alignment apparatus 40, is shaped like a disk and made of alumina ceramic that is an insulator, for example. The surface of the wafer holder WH is polished to be smooth. The wafer holder WH has a notch NT on its periphery.

Furthermore, the wafer holder WH has an electrode EL embedded therein, to which a voltage is applied to attract a semiconductor wafer W by electrostatic force. The second XYθ stage 45 has a direct current power source DC that generates a direct current voltage to be applied to the electrode EL. When a voltage is applied to the electrode EL, the wafer holder WH attracts a semiconductor wafer W by electrostatic force and holds the semiconductor wafer W.

The wafer holder WH further has fiducial marks FM in the vicinity of its periphery. Specifically speaking, the fiducial marks FM are symmetrically positioned to form a pair with respect to the center of the wafer holder WH. The fiducial marks FM are shaped like a cross or circle and formed on transparent quartz glass. Here, openings are formed through the wafer holder WH in the regions of the wafer holder WH in which the fiducial marks FM are positioned, so that the fiducial marks FM can be observed from both the front and back sides of the wafer holder WH.

The wafer holder alignment camera CA2, which is secured at a predetermined position, may have a magnification ratio of approximately 1:1 to 10:1 and include an auto-focusing mechanism as necessary. The second XYθ stage 45 moves in the X and Y directions, so that the wafer holder alignment camera CA2 can observe the fiducial marks FM, in other words, so that the fiducial marks FM are positioned immediately below the wafer holder alignment camera CA2. Thus, the wafer holder WH can be aligned by using the position of the wafer holder alignment camera CA2 as a reference point.

The second interferometer 42 always monitors the position of the second XYθ stage 45. The position of the second XYθ stage 45 detected by the second interferometer 42 is sent to the wafer holder pre-alignment controller 41. A position signal representing the positions of the fiducial marks FM observed by the wafer holder alignment camera CA2 is also sent to the wafer holder pre-alignment controller 41.

Based on the position of the second XYθ stage 45 and the positions of the fiducial marks FM, the wafer holder pre-alignment controller 41 calculates the displacement of the wafer holder WH with respect to a predetermined position in the X, Y and θ directions, and then moves and rotates the second XYθ stage 45 in such a manner to eliminate the calculated displacement. As a result of such pre-alignment, the wafer holder WH is aligned to be positioned within a certain range from an intended reference value according to design specifications, for example, within approximately 30 µm or less.

The aligned wafer holder WH remains at the position until a semiconductor wafer W is loaded. Here, the semiconductor wafer W maintains the aligned state achieved by the wafer pre-alignment apparatus 20 while transported as previously described. Therefore, when the aligned semiconductor wafer W is loaded onto the aligned wafer holder WH, the relative displacement between the semiconductor wafer W and the wafer holder WH falls within a certain range, for example, a range of approximately 100 µm or less.

Here, the wafer holder pre-alignment apparatus 40 similarly further has a second positioning pole 47 that is secured at a predetermined position. Although not shown in the drawings, the wafer loader WL, which is designed to transport a semiconductor wafer W, is kept stationary at a predetermined position by bringing the positioning arm AA of the wafer loader WL into a contact with the second positioning pole, and then loads the semiconductor wafer W onto the wafer holder WH.

Figure 8:
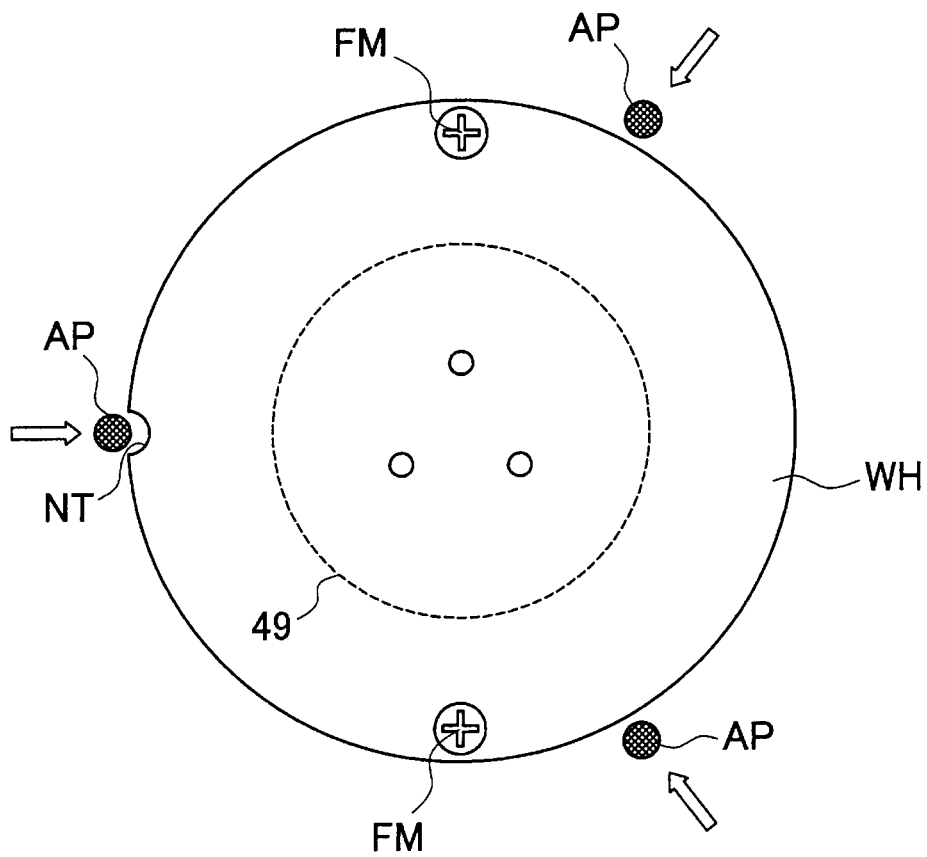
FIG. 8 is a top view illustrating a different wafer holder pre-alignment apparatus 40.

FIG. 8 is a top view illustrating a different wafer holder pre-alignment apparatus 40. This wafer holder pre-alignment apparatus 40 includes a table 49 on which a wafer holder WH is placed, and three abutting pins AP that abut the lateral surface of the wafer holder WH placed on the table 49.

The abutting pins AP individually move in the radial direction of the table 49 as indicated by the arrows in FIG. 8, to push the wafer holder WH at the lateral edge surface thereof. Thus, the abutting pins AP can move the wafer holder WH on the table 49 in any direction.

The table 49 rotates around a rotation axis extending vertically to the plane of the paper on which FIG. 8 is drawn. Thus, one of the abutting pins AP may be guided into the notch NT of the wafer holder WH, in addition to the alignment of the center of the wafer holder WH. As described above, the wafer holder WH can be pre-aligned by controlling at least three abutting pins AP to abut the wafer holder WH.

Alternatively, one or two of the above-described abutting pins AP may be secured at predetermined positions. In this case, the wafer holder WH can be easily pre-aligned by pressing the wafer holder WH against the secured abutting pins AP and thus using the positions of the secured pins AP as reference points. Although not shown, aligning members similar to the abutting pins AP shown in FIG. 8 may be provided in the wafer pre-alignment apparatus 20, so that a semiconductor wafer W can be pre-aligned by controlling the semiconductor wafer W to abut the alignment members.

Although not shown, the table 49 may be replaced with a θ stage and a line sensor SS may be provided in the wafer holder pre-alignment apparatus 40 to realize a similar configuration as the wafer pre-alignment apparatus 20 shown in FIGS. 6A to 6C. In this way, the wafer holder pre-alignment apparatus 40 can detect the displacement of the wafer holder WH based on the degree of eccentricity and the amount of the rotation of the wafer holder WH.

Figure 9:
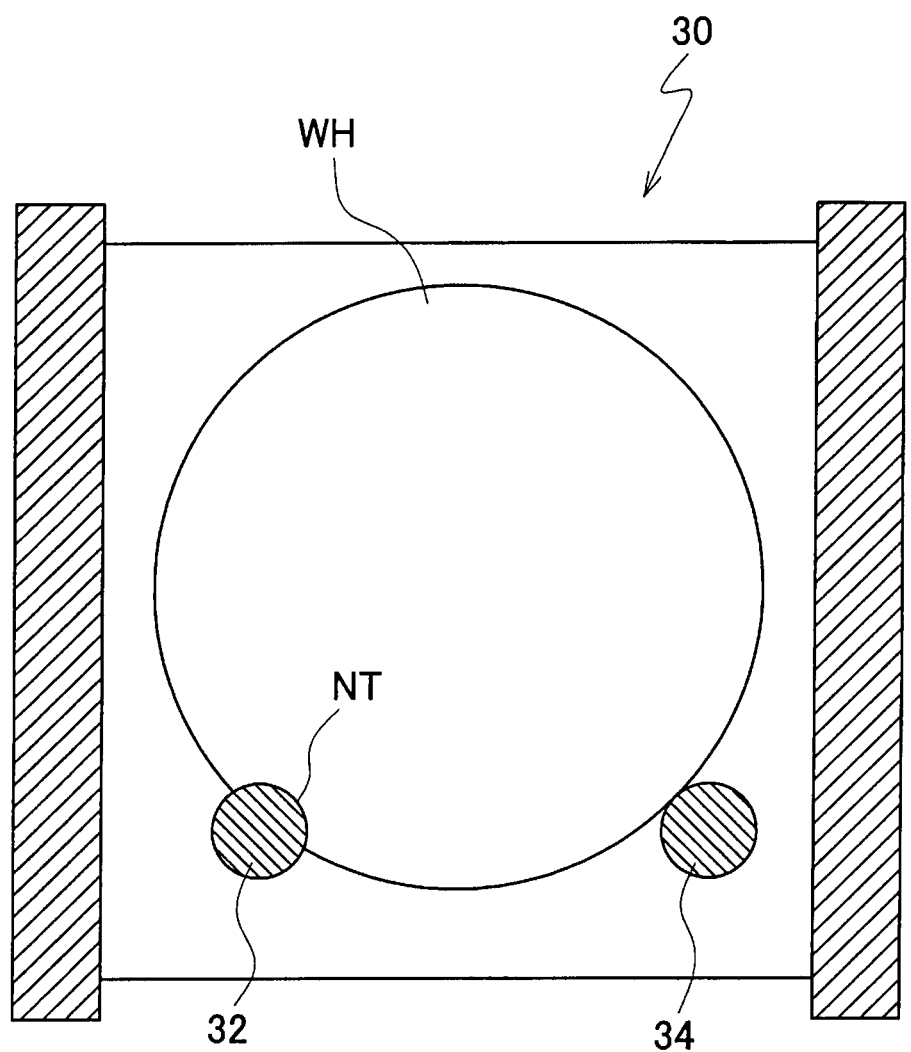
FIG. 9 is a top view illustrating a further different wafer holder pre-alignment apparatus 40.

FIG. 9 is a schematic view illustrating the configuration of a further different wafer holder pre-alignment apparatus. This wafer holder pre-alignment apparatus includes a notch positioning pole 32 and an edge positioning pole 34 that are provided in the wafer holder storage 30. The notch positioning pole 32 and the edge positioning pole 34 are secured at predetermined positions within the wafer holder storage 30.

Accordingly, when stored into the wafer holder storage 30, a wafer holder WH is pushed into the wafer holder storage 30 in such a manner that the notch positioning pole 32 is guided into the notch NT of the wafer holder WH and the edge positioning pole 34 abuts the edge of the wafer WH. In this simple manner, the wafer holder WH can be aligned with some accuracy with reference to the positions of the notch positioning pole 32 and the edge positioning pole 34.

The notch positioning pole 32 and the edge positioning pole 34 are not limited to being provided within the wafer holder storage 30. For example, the notch positioning pole 32 and the edge positioning pole 34 may be provided on the stage of the aligner 50, described later, to perform pre-alignment.

The above-described pre-alignment can be performed in a simple manner and completed within a short time period. Accordingly, even if performed, the above-described pre-alignment does not lower the throughput of the entire multi-layered substrate manufacturing process.

Figure 10:
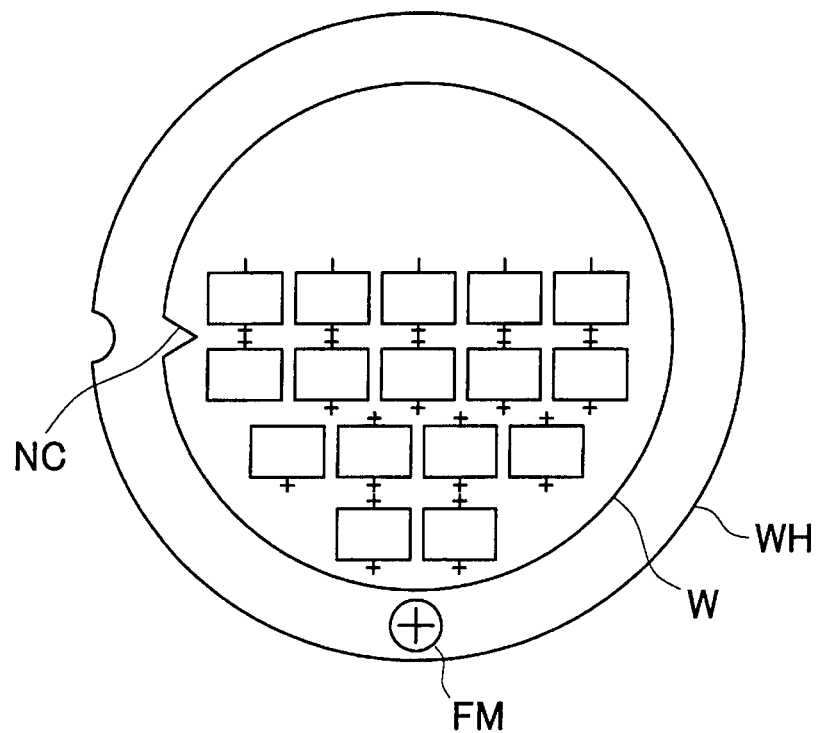
FIG. 10 is a top view illustrating a wafer holder WH on which a semiconductor wafer W is placed.

FIG. 10 is a top view illustrating a wafer holder WH on which a semiconductor wafer W is placed. As shown in FIG. 10, alignment marks are formed in the semiconductor wafer W. The wafer holder WH has a fiducial mark FM.

The alignment marks AM of the semiconductor wafer W can be positioned within a predetermined range from the fiducial mark FM of the wafer holder WH. Thus, the semiconductor wafer W on the wafer holder WH is positioned within 100 µm or less, including the error of the wafer loader WL, from the intended reference value according to the design specifications.

Figure 11:
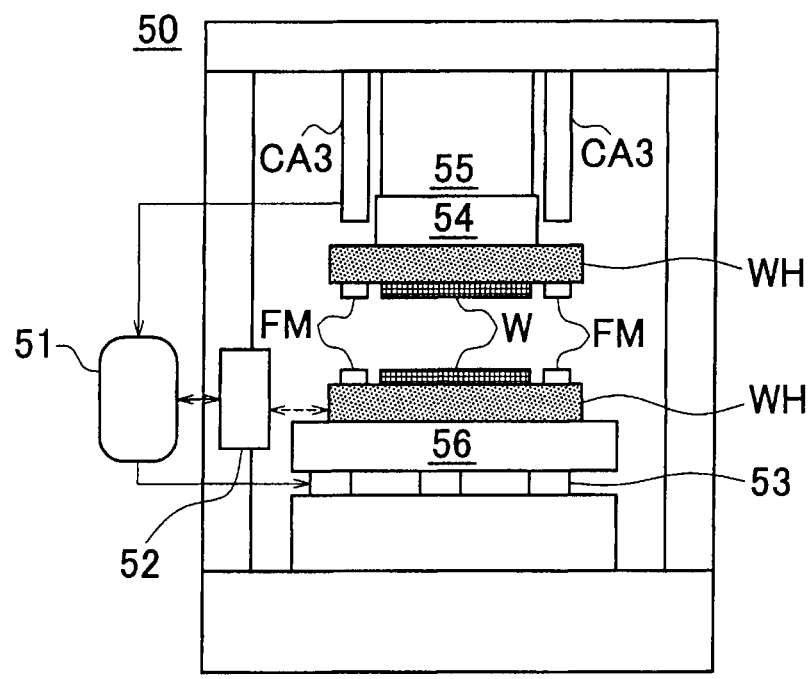
FIG. 11 is a schematic view illustrating the structure of an aligner 50.

FIG. 11 is a schematic view illustrating the structure of the aligner 50, which stacks semiconductor wafers on one another by performing a process equivalent to the step S107 shown in FIG. 3. The aligner 50 includes a third laser interferometer (hereinafter, referred to as the third interferometer) 52, a first table 54, a second table 56, and a high-accuracy alignment camera CA3.

The first table 54 and the second table 56 respectively have horizontal holding surfaces that oppose each other. On the first table 54, a first wafer holder WH holding a first semiconductor wafer W is secured. On the second table 56, a second wafer holder WH holding a second semiconductor wafer W is secured.

The first table 54 is supported by a first driving apparatus 55 and micro-moves. The second table 56 is supported by a second driving apparatus 53 and moves at least in X and Y directions. How much the second table 56 moves is monitored by the third interferometer 52.

The high-accuracy alignment camera CA3 can be adjusted so that the fiducial marks FM of the first wafer holder WH held by the first table 54 are positioned on the object plane of the optical system, and observes the fiducial marks FM from the back side of the wafer holder WH. The high-accuracy alignment camera CA3 also observes the fiducial marks FM of the second wafer holder WH held by the second table 56 or the alignment marks AM of the semiconductor wafer W held by the second wafer holder WH from the front side of the second wafer holder WH or semiconductor wafer W.

Here, the distance from the high-accuracy alignment camera CA3 to the fiducial marks FM of the first wafer holder WH is different from the distance from the high-accuracy alignment camera CA3 to the fiducial marks of the second wafer holder WH. Therefore, to enable the high accuracy alignment camera CA3 to observe the both fiducial marks FM, the high-accuracy alignment camera CA3 is positioned differently or the optical system is adjusted to make a focus at a different position.

The high-accuracy alignment camera CA3 has a magnification ratio of approximately 20:1. Here, as the magnification ratio increases, the field of view decreases. Specifically speaking, for example, the high-accuracy alignment camera CA3 has a field of view of approximately 400 μm×400 μm. However, since the wafer pre-alignment apparatus 20 and the wafer holder pre-alignment apparatus 40 have pre-aligned the semiconductor wafer W and the wafer holder WH, it is assured that the fiducial marks FM or alignment marks AM are positioned within the field of view of the high-accuracy alignment camera CA3.

The position of the second table 56 detected by the third interferometer 52 is sent to an aligner controller 51. Position signals representing the positions of the alignment marks AM and the fiducial marks FM observed by the high-accuracy alignment camera CA3 are also sent to the aligner controller 51. Based on these signals, the aligner controller 51 sends a drive signal to the first driving apparatus 55 or second driving apparatus 53.

The following describes how the aligner 50 aligns semiconductor wafers W to each other. The first wafer holder WH, which is transported into the aligner 50 by the wafer holder loader WHL, is initially secured onto the second table 56. The aligner 50 uses the high-accuracy alignment camera CA3 and the third interferometer 52 to determine the positional relation between the fiducial marks FM of the first wafer holder WH and the first semiconductor wafer W held by the first wafer holder WH.

After the relative positional relation between the fiducial marks FM and the alignment marks AM is measured as described above, the first wafer holder WH and the first semiconductor wafer W are inverted and transported to the first table 54 by the wafer holder loader WHL. Since the positional relation between the fiducial marks FM of the first wafer holder WH and the alignment marks of the first semiconductor wafer W has already been identified, the positions of the alignment marks of the first semiconductor wafer W can be determined by detecting the positions of the fiducial marks FM from the back side of the first wafer holder WH by using the high-accuracy alignment camera CA3.

After this, the wafer holder loader WHL transports the second wafer holder WH holding the second semiconductor wafer W into the aligner 50 and secure the second wafer holder WH on the vacant second table 56. The aligner controller 51 controls the second driving apparatus 53 to operate, and then controls the high-accuracy alignment camera CA3 to observe the fiducial marks FM of the second wafer holder WH while measuring the position of the second table 56 by using the third interferometer 52. The aligner controller 51 sequentially moves the alignment marks AM on the second semiconductor wafer W so as to appear within the field of view of the high-accuracy alignment camera CA3 and measures the position of the second table 56 by means of the third interferometer 52. In this manner, the positional relation between the fiducial marks FM and the respective alignment marks AM is determined.

The high-accuracy alignment camera CA3 has an indicator positioned within its field of view, and the positional relation between the indicator and the optical axis of the high-accuracy alignment camera CA3 is defined. More specifically, the indicator is positioned so as to be optically conjugate with the imaging plane of the microscope. In this way, the positional relation between the fiducial marks FM and the optical axis of the high-accuracy alignment camera CA3 is identified by observing the image within the field of view of the high-accuracy alignment camera CA3.

The positions of the fiducial marks FM are determined by examining the relative positions of the fiducial marks FM with respect to the indicator of the high-accuracy alignment camera CA3. Since the positional relation between the fiducial marks FM of the wafer holder WH and the alignment marks AM of the semiconductor wafer W has already been measured, the positions of the alignment marks AM of the semiconductor wafer W1 can be determined by referring to the positions of the fiducial marks FM.

After detecting the positions of the alignment marks AM on the first semiconductor wafer W and the positions of the alignment marks AM on the second semiconductor wafer W through the positions of the fiducial marks FM, the aligner 50 adjusts the position at which the first semiconductor wafer W and the second semiconductor wafer W should overlap. The aligner controller 51 calculates the overlapping position by using the least squares method in such a manner that the positional error between the alignment marks AM of the first semiconductor wafer W and the alignment marks AM of the second semiconductor wafer W is minimized. Based on the result of the calculation, the aligner controller 51 moves the second table 56.

According to the above description, the overlapping position is optimized by referring to the positional relation between the alignment marks AM of the two wafers W. Alternatively, however, the position at which semiconductor wafers W should overlap and the postures of the semiconductor wafers W may be designated in advance within a reference coordinate system, and the positions and the postures of respective semiconductor wafers W may be measured. In this case, the alignment marks AM of the two semiconductor wafers W may be differently positioned.

Since the high-accuracy alignment camera CA3 can directly observe the alignment marks AM of the semiconductor wafer W secured on the second table 56, the position of the second wafer holder WH can be identified without observing the fiducial marks FM. If such is the case, a wafer holder WH without a fiducial mark FM can be used as the second wafer holder. Furthermore, since the position of the second table 56 is observed with high accuracy by using the third interferometer 52, the position of the second semiconductor wafer W can be identified without observing the fiducial marks of the second wafer holder WH.

After the positional relation between the first semiconductor wafer W and the second semiconductor wafer W is determined, the aligner controller 51 uses the second driving apparatus 53 to move the two semiconductor wafers W closer to each other. While moving the two semiconductor wafers W closer to each other, the aligner controller 51 performs a feedback control on the second driving apparatus 53 by measuring the movement of the second table 56 in the X-Y plane with the use of the third interferometer 52 and limiting the displacement within a predetermined range.

In the above-described manner, the first semiconductor wafer W and the second semiconductor wafer W are stacked on one another in the state of being aligned to each other. At this stage, however, the first semiconductor wafer W and the second semiconductor wafer W do not adhere to each other. Therefore, the first wafer holder WH and the second wafer holder WH are clamped or attached to each other to keep the first and second semiconductor wafers W aligned to each other. The first wafer holder WH and the second wafer holder WH, which are being clamped, are transported by the wafer holder loader WHL from the aligner 50 to the pressurizing apparatus 70.

Here, the accuracy with which the semiconductor wafers W and the wafer holders WH are pre-aligned in the wafer pre-alignment apparatus 20 and the wafer holder pre-alignment apparatus 40 is lower than the final accuracy with which the semiconductor wafers W and the semiconductor wafer holders WH are aligned by the aligner 50. However, since the pre-alignment processes align the semiconductor wafers W and the wafer holders WH with certain accuracy within the range of the accuracy determined for the respective pre-alignment processes, the fiducial marks FM or alignment marks AM are highly likely to appear within the small field of view of the high-accuracy alignment camera CA3.

Furthermore, after semiconductor wafers W are pre-aligned separately from wafer holders WH, the pre-aligned semiconductor wafers W are loaded onto the pre-aligned wafer holders WH. Therefore, it is prevented to take an enormously long time to detect the fiducial marks FM and the alignment marks AM at the first table 54. Consequently, the throughput of the multilayered substrate manufacturing process can be improved.

Since semiconductor wafers W are loaded onto wafer holders WH after the semiconductor wafers W are pre-aligned separately from the wafer holders WH, the relative displacement between the alignment marks AM of the semiconductor wafer W and the fiducial marks FM of the wafer holder WH can fall within a predetermined range as described above.

When the relative displacement between the alignment marks AM of the semiconductor wafer W and the fiducial marks FM of the wafer holder WH exceeds, for example, the measurable range of the third interferometer 52 of the aligner 50, the third interferometer 52 cannot measure the amount of the movement of the second table 56 if the aligner 50 moves the second table 56 to align the semiconductor wafers W to each other.

In a case where the alignment marks AM of each semiconductor wafer WH are displaced from the corresponding fiducial marks FM by the same amount in the same direction, when two semiconductor wafers WH are positioned to oppose each other in order to be stacked on one another, the relative displacement between the two sets of alignment marks AM approximately doubles. Therefore, when the displacement of the alignment marks AM with respect to the fiducial marks FM is large as previously mentioned, the second table 56 needs to be greatly moved to align the alignment marks AM of the respective semiconductor wafers W to each other. This requires the aligner 50 to perform complicated operations, thereby lowering the throughput.

According to the present invention, however, the displacement can be limited within a predetermined range as described above. Therefore, by determining the predetermined range in such a manner that the amount of the movement of the second table 56 does not exceed the measurable range of the interferometer 52, the interferometer 52 can be prevented from becoming incapable of measuring the amount of the movement. Also, the present invention can prevent degradation in throughput which is caused by large displacement of the alignment marks AM with respect to the fiducial marks FM.

Also, the detection process of the fiducial marks FM and the alignment marks AM at the first table 54 is prevented from resulting in unsuccessful outcome. Therefore, the yield of the multilayered substrates is improved relative to the semiconductor wafers W that are the materials. Furthermore, it is avoided to use a large microscope with a wide field of view to impellent the high-accuracy alignment camera CA3.

Figure 12:
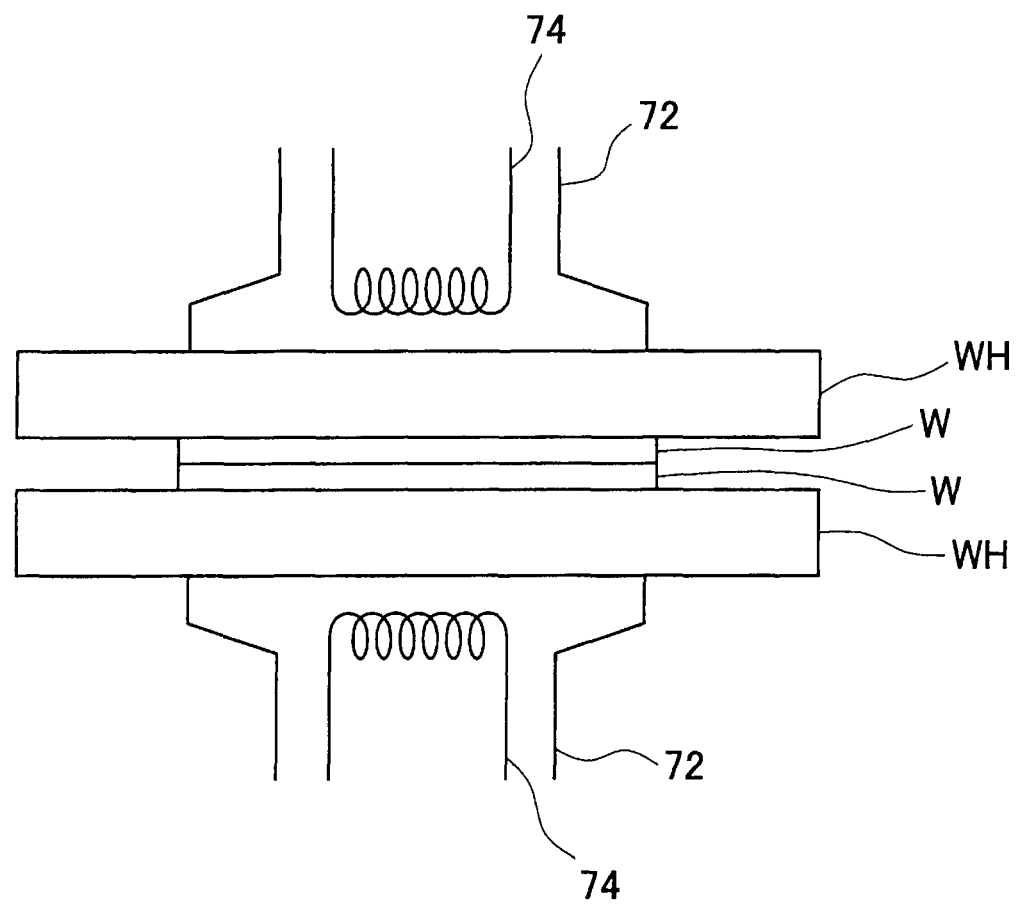
FIG. 12 is a schematic view illustrating the structure of a pressurizing apparatus 70.

FIG. 12 is a schematic view illustrating the structure of the pressurizing apparatus 70. The pressurizing apparatus 70 includes a pair of pressing members 72 and heaters 74 provided in the respective pressing members 72.

The pressing members 72 bring their opposing press surfaces closer to each other to apply pressure to the semiconductor wafers W and the wafer holders WH sandwiched therebetween. The heaters 74 heat the semiconductor wafers W, for example, by transmitting the heat generated by heating wires through the pressing members 72 in contact with the wafer holders WH. In this way, the semiconductor wafers W that have been stacked on one another are permanently attached to each other, to form a multilayered substrate.

Alternatively, the pressurizing apparatus 70 may apply a predetermined pressure by using pressurizing cylinders without heating over a predetermined period of time to bond together metal bumps made of Cu or the like, which are electrodes on the semiconductor wafers W. Alternatively, the semiconductor wafers W may be attached to each other by injecting a resin between the semiconductor wafers W. For example, Japanese Patent Application Publication No. 2002-064266 discloses a technique of bonding together metal bumps, without heating the semiconductor wafers W, by using plasmas, ion beams, atom beams, radical beams, or laser.

According to the above-described embodiment, the wafer pre-alignment apparatus 20 and the wafer holder pre-alignment apparatus 40 are independently implemented. As an alternative example, however, the wafer holders may be pre-aligned at the second table 56 of the aligner 50. As a further alternative example, the semiconductor wafers W may be loaded onto the wafer holders WH at the second table 56.

Furthermore, as already described with reference to FIG. 9, the wafer holders WH may be pre-aligned in the wafer holder storage 30. In this embodiment, the area required to install the multilayered substrate manufacturing apparatus 100 can be reduced.

According to the above-described exemplary embodiment, the aligner 50 includes the high-accuracy alignment camera CA3 that is capable of observing the alignment marks AM of the semiconductor wafer W secured on the second table 56. Alternatively, however, the present invention can be achieved by employing an aligner that includes an alignment camera for observing the semiconductor wafer W on the first table 54 and another alignment camera for observing the semiconductor wafer W on the second table 56. In this case, since the alignment marks AM of each semiconductor wafer W can be directly observed by the corresponding alignment camera, the aligner 50 can align the respective semiconductor wafers W to each other with reference to the alignment marks AM, instead of the fiducial marks FM. Consequently, such a configuration can remove the necessity of the fiducial marks FM of the first and second wafer holders WH. When the first and second wafer holders WH have no fiducial marks FM, the first and second wafer holders WH can be pre-aligned, for example, by using the wafer holder pre-alignment apparatus shown in FIG. 9.

According to the above description, the alignment method relating to the present invention is applied, for example, to the multilayered substrate manufacturing apparatus 100, but may be effectively used to align pattern formed substrates such as to-be-exposed substrates and reticles in an exposure apparatus used for the photolithography step of the semiconductor apparatus manufacturing process.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A substrate stacking apparatus comprising:
   a first aligner that aligns a first substrate to a first substrate reference position and a second substrate to a second substrate reference position;
   a first table that receives and has the first substrate that has been aligned by the first aligner placed thereon;
   a second table that receives and has the second substrate that has been aligned by the first aligner placed thereon so as to oppose the first substrate, the second table being movable relative to the first table; and
   a second aligner that aligns, to a first substrate holder reference position, a first substrate holder adapted to hold the first substrate that has been aligned by the first aligner and aligns, to a second substrate holder reference position, a second substrate holder adapted to hold the second substrate that has been aligned by the first aligner, wherein
   the substrate stacking apparatus aligns, relative to each other, the first substrate and the second substrate while the first substrate is on the first table and the second substrate is on the second table and then stacks the first substrate and the second substrate on one another, and
   at least one of the first aligner and the second aligner performs alignment such that a positional relation between the first substrate and the first substrate holder and a positional relation between the second substrate and the second substrate holder fall in a predetermined range.

2. The substrate stacking apparatus as set forth in claim 1, wherein
   the first substrate is aligned with reference to a position of a reference mark of the first substrate holder that has the first substrate loaded thereon, and
   the second substrate is aligned with reference to a position of an alignment mark of the second substrate.

3. The substrate stacking apparatus as set forth in claim 1, wherein
   the first substrate is aligned with reference to a position of a reference mark of the first substrate holder that has the first substrate loaded thereon, and
   the second substrate is aligned with reference to an amount of movement of a stage that supports the second substrate and the second substrate holder that holds the second substrate.

4. A multilayered substrate manufacturing apparatus comprising:
   the substrate stacking apparatus as set forth in claim 1; and
   a pressurizing section that applies a pressure to the first and second substrates that have been stacked on one another to permanently bond the first and second substrates to each other.

5. The substrate stacking apparatus as set forth in claim 1, further comprising
   a transporter that transports onto the first table the first substrate holder that has been aligned by the second aligner and transports onto the second table the second substrate holder that has been aligned by the second aligner.

6. A substrate stacking apparatus as set forth in claim 1, wherein
   the second aligner aligns the first substrate holder while no substrate is held by the substrate holder,
   the substrate stacking apparatus further comprises a position detector that detects a position of an alignment mark of the first substrate while the first substrate is held by the first substrate holder, and
   the position detector observes a reference mark formed on the first substrate holder that is capable of being observed from front and back sides of the first substrate holder.

7. The substrate stacking apparatus as set forth in claim 1, wherein
   the second aligner aligns the first substrate holder while the first substrate is not held by the first substrate holder, and
   the substrate stacking apparatus further comprises a position detector that detects a position of an alignment mark of the first substrate while the first substrate is held by the first substrate holder.

8. The substrate stacking apparatus as set forth in claim 1, further comprising
a transporter that transports the first and second substrate holders onto the first and second tables, wherein
the position detector detects positions of alignment marks of the first and second substrates while the first and second substrates are held by the first and second substrate holders and the first and second substrate holders are on the first and second tables.

9. The substrate stacking apparatus as set forth in claim 1, wherein
the position detector detects a relative position of one of the first and second substrates with respect to the position detector and a relative position of another of the first and second substrates with respect to the position detector.

10. The substrate stacking apparatus as set forth in claim 1, wherein
the first substrate reference position is the same as the second substrate reference position, and the first substrate holder reference position is the same as the second substrate holder reference position.

11. The substrate stacking apparatus as set forth in claim 1, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

12. The substrate stacking apparatus as set forth in claim 1, further comprising
a detector that detects an alignment mark of the first substrate that has been aligned by the first aligner and an alignment mark of the second substrate that has been aligned by the first aligner, wherein
the first aligner aligns the first substrate and the second substrate in such a manner that the alignment marks of the first and second substrates are arranged within a detectable region of the detector.

13. The substrate stacking apparatus as set forth in claim 8, wherein
the transporter transports each of the first and second substrate holders with a corresponding one of the first and second substrates being held thereon.

14. The substrate stacking apparatus as set forth in claim 8, wherein
the position detector includes a camera that observes the substrate on the first table and a camera that observes the substrate on the second table.

15. The substrate stacking apparatus as set forth in claim 9, wherein
the position detector includes a microscope and detects a positional relation between each of the first and second substrates and a mark arranged within a field of view of the microscope.

16. The substrate stacking apparatus as set forth in claim 10, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

17. The substrate stacking apparatus as set forth in claim 11, wherein
the position measuring section is an interferometer.

18. The substrate stacking apparatus as set forth in claim 16, wherein
the position measuring section is an interferometer.

19. The substrate stacking apparatus as set forth in claim 12, wherein
the detector detects the alignment mark of the first substrate while the first substrate is held on the first substrate holder and the first substrate holder is on the first table and the alignment mark of the second substrate while the second substrate is held on the second substrate holder and the second substrate holder is on the second table.

20. The substrate stacking apparatus as set forth in claim 12, wherein
the detector detects a relative position of the first substrate with respect to the detector and a relative position of the second substrate with respect to the detector.

21. The substrate stacking apparatus as set forth in claim 12, wherein
the detector includes a microscope and the detectable region is a field of view of the microscope.

22. The substrate stacking apparatus as set forth in claim 20, wherein
the detector includes a microscope and detects a positional relation between a mark arranged within a field of view of the microscope and each of the first and second substrates.

23. A substrate stacking apparatus comprising:
an aligner that aligns a first substrate to a first substrate reference position and a second substrate to a second substrate reference position;
a first table that receives and has the first substrate that has been aligned by the aligner placed thereon; and
a second table that receives and has the second substrate that has been aligned by the aligner placed thereon so as to oppose the first substrate, the second table being movable relative to the first table, wherein
the substrate stacking apparatus aligns, relative to each other, the first substrate and the second substrate while the first substrate is on the first table and the second substrate is on the second table and then stacks the first substrate and the second substrate on one another, and
the aligner aligns the first substrate and the second substrate in such a manner that a difference between a relative position of the first substrate with respect to the first substrate reference position and a relative position of the second substrate with respect to the second substrate reference position falls in a predetermined range.

24. The substrate stacking apparatus as set forth in claim 23, wherein
the first substrate reference position is the same as the second substrate reference position.

25. The substrate stacking apparatus as set forth in claim 23, further comprising:
an actuating section that moves the first table and the second table relative to each other; and
a position measuring section that measures a positional relation between the first table and the second table, wherein the predetermined range is set so as to allow the position measuring section to measure the positional relation when the first table and the second table are moved by the actuating section.

26. The substrate stacking apparatus as set forth in claim 23, further comprising:
a detector that detects an alignment mark of the first substrate that has been aligned by the aligner and an alignment mark of the second substrate that has been aligned by the aligner, wherein
the aligner aligns the first substrate and the second substrate in such a manner that the alignment marks of the first and second substrates are arranged within a detectable region of the detector.

27. The substrate stacking apparatus as set forth in claim 24, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

28. A substrate stacking apparatus comprising:
a first aligner that aligns a first substrate to a first substrate reference position and a second substrate to a second substrate reference position;
a second aligner that aligns, to a first substrate holder reference position, a first substrate holder adapted to hold the first substrate that has been aligned by the first aligner and aligns, to a second substrate holder reference position, a second substrate holder adapted to hold the second substrate that has been aligned by the first aligner, wherein
the substrate stacking apparatus aligns, relative to each other, the first substrate and the second substrate and then stacks the first substrate and the second substrate on one another, and
at least one of the first aligner and the second aligner performs alignment such that a positional relation between the first substrate and the first substrate holder and a positional relation between the second substrate and the second substrate holder fall in a predetermined range.

29. The substrate stacking apparatus as set forth in claim 28, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

30. The substrate stacking apparatus as set forth in claim 28, further comprising:
a detector that detects an alignment mark of the first substrate that has been aligned by the first aligner and an alignment mark of the second substrate that has been aligned by the first aligner, wherein
the first aligner aligns the first substrate and the second substrate in such a manner that the alignment marks of the first and second substrates are arranged within a detectable region of the detector.

31. The substrate stacking apparatus as set forth in claim 28, wherein
the first substrate reference position is the same as the second substrate reference position, and the first substrate holder reference position is the same as the second substrate holder reference position.

32. The substrate stacking apparatus as set forth in claim 31, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

33. A substrate stacking apparatus comprising:
an aligner that aligns, in a first alignment action, a first substrate to a first substrate reference position and a second substrate to a second substrate reference position, wherein
the substrate stacking apparatus aligns, separately and/or after the first alignment action, the first substrate and the second substrate relative to each other while the first substrate is on a first table and the second substrate is on a second table and then stacks the first substrate and the second substrate on one another, and
the aligner aligns, in the first alignment action, the first substrate and the second substrate in such a manner that a difference between a relative position of the first substrate with respect to the first substrate reference position and a relative position of the second substrate with respect to the second substrate reference position falls in a predetermined range.

34. The substrate stacking apparatus as set forth in claim 33, further comprising:
an actuating section that moves the first table and the second table relative to each other; and
a position measuring section that measures a positional relation between the first table and the second table, wherein
the predetermined range is set so as to allow the position measuring section to measure the positional relation when the first table and the second table are moved by the actuating section.

35. The substrate stacking apparatus as set forth in claim 33, further comprising:
a detector that detects an alignment mark of the first substrate that has been aligned by the aligner and an alignment mark of the second substrate that has been aligned by the aligner, wherein
the aligner aligns the first substrate and the second substrate in such a manner that the alignment marks of the first and second substrates are arranged within a detectable region of the detector.

36. The substrate stacking apparatus as set forth in claim 33, wherein
the first substrate reference position is the same as the second substrate reference position.

37. The substrate stacking apparatus as set forth in claim 36, further comprising:
an actuating section that moves the first table and the second table relative to each other; and
a position measuring section that measures a positional relation between the first table and the second table, wherein the predetermined range is set so as to allow the position measuring section to measure the positional relation when the first table and the second table are moved by the actuating section.

38. A substrate stacking apparatus comprising:
- an aligner that aligns a first substrate to a first substrate reference position and a second substrate to a second substrate reference position;
- a first table that receives and has the first substrate that has been aligned by the aligner placed thereon; and
- a second table that receives and has the second substrate that has been aligned by the aligner placed thereon so as to oppose the first substrate, the second table being movable relative to the first table, wherein
- the substrate stacking apparatus aligns, relative to each other, the first substrate and the second substrate while the first substrate is on the first table and the second substrate is on the second table and then stacks the first substrate and the second substrate on one another, and
- the aligner aligns the first substrate with respect to the first substrate reference position and aligns the second substrate with respect to the second substrate reference position in such a manner that a difference between the positions of the first substrate and the second substrate falls in a predetermined range.

39. The substrate stacking apparatus as set forth in claim 38, further comprising:
- an actuating section that moves the first table and the second table relative to each other; and
- a position measuring section that measures a positional relation between the first table and the second table, wherein
- the predetermined range is set so as to allow the position measuring section to measure the positional relation when the first table and the second table are moved by the actuating section.

40. The substrate stacking apparatus as set forth in claim 38, further comprising:
- a detector that detects an alignment mark of the first substrate that has been aligned by the aligner and an alignment mark of the second substrate that has been aligned by the aligner, wherein
- the aligner aligns the first substrate and the second substrate in such a manner that the alignment marks of the first and second substrates are arranged within a detectable region of the detector.

41. The substrate stacking apparatus as set forth in claim 38, wherein
- the first substrate reference position is the same as the second substrate reference position.

42. The substrate stacking apparatus as set forth in claim 41, further comprising:
- an actuating section that moves the first table and the second table relative to each other; and
- a position measuring section that measures a positional relation between the first table and the second table, wherein the predetermined range is set so as to allow the position measuring section to measure the positional relation when the first table and the second table are moved by the actuating section.

43. A substrate stacking apparatus comprising:
- an aligner that aligns, in a first alignment action, a first substrate to a first substrate reference position and a second substrate to a second substrate reference position, wherein
- the substrate stacking apparatus aligns, separately and/or after the first alignment action, the first substrate and the second substrate relative to each other while the first substrate is on a first table and the second substrate is on a second table and then stacks the first substrate and the second substrate on one another, and
- the aligner aligns, in the first alignment action, the first substrate with respect to the first substrate reference position and aligns the second substrate with respect to the second substrate reference position in such a manner that a difference between the positions of the first substrate and the second substrate falls in a predetermined range.

44. The substrate stacking apparatus as set forth in claim 43, further comprising:
- an actuating section that moves the first table and the second table relative to each other; and
- a position measuring section that measures a positional relation between the first table and the second table, wherein
- the predetermined range is set so as to allow the position measuring section to measure the positional relation when the first table and the second table are moved by the actuating section.

45. The substrate stacking apparatus as set forth in claim 43, further comprising:
- a detector that detects an alignment mark of the first substrate that has been aligned by the aligner and an alignment mark of the second substrate that has been aligned by the aligner, wherein
- the aligner aligns the first substrate and the second substrate in such a manner that the alignment marks of the first and second substrates are arranged within a detectable region of the detector.

46. The substrate stacking apparatus as set forth in claim 43, wherein
- the first substrate reference position is the same as the second substrate reference position.

47. The substrate stacking apparatus as set forth in claim 46, further comprising:
- an actuating section that moves the first table and the second table relative to each other; and
- a position measuring section that measures a positional relation between the first table and the second table, wherein
- the predetermined range is set so as to allow the position measuring section to measure the positional relation when the first table and the second table are moved by the actuating section.

* * * * *